(12) United States Patent
Yang et al.

(10) Patent No.: US 12,322,724 B2
(45) Date of Patent: Jun. 3, 2025

(54) BONDING METHOD FOR COPPER-COPPER METAL WITH HYDRAZINE HYDRATE

(71) Applicant: ANHUI UNIVERSITY, Hefei (CN)

(72) Inventors: Wenhua Yang, Hefei (CN); Xin Huang, Hefei (CN); Chao Xie, Hefei (CN); Zhixiang Huang, Hefei (CN)

(73) Assignee: ANHUI UNIVERSITY, Hefei (CN)

( * ) Notice: Subject to any disclaimer, the term of this patent is extended or adjusted under 35 U.S.C. 154(b) by 93 days.

(21) Appl. No.: 18/126,541

(22) Filed: Mar. 27, 2023

(65) Prior Publication Data

US 2024/0222314 A1 Jul. 4, 2024

(30) Foreign Application Priority Data

Dec. 30, 2022 (CN) .......................... 202211721856.9

(51) Int. Cl.
*B23K 20/02* (2006.01)
*C04B 37/00* (2006.01)
*H01L 23/00* (2006.01)

(52) U.S. Cl.
CPC ............ *H01L 24/80* (2013.01); *B23K 20/023* (2013.01); *C04B 37/006* (2013.01); *C04B 2237/124* (2013.01); *C04B 2237/52* (2013.01); *H01L 2224/80011* (2013.01); *H01L 2224/80075* (2013.01); *H01L 2224/80095* (2013.01);
(Continued)

(58) Field of Classification Search
CPC ........ B23K 20/023; H01L 2224/80011; H01L 2224/80075; H01L 2224/80095; H01L 2224/80203; H01L 2224/80895; H01L 24/80; C04B 2237/124; C04B 2237/407; C04B 2237/52; C04B 37/006
See application file for complete search history.

(56) References Cited

U.S. PATENT DOCUMENTS 2,980,562 A * 4/1961 Matter ............... B23K 35/3615
148/23
3,087,005 A * 4/1963 Sabatino ................ B22D 25/04
164/109
(Continued)

FOREIGN PATENT DOCUMENTS

| CN | 106449451 A | * | 2/2017 | ............. H01L 24/27 |
| CN | 110449734 A | * | 11/2019 | ............... B08B 3/08 |
| RU | 2386521 C1 | * | 4/2010 | |

OTHER PUBLICATIONS

Shie et al., "A kinetic model of copper-to-copper direct bonding under thermal compression", Journal of Materials Research and Technology, vol. 15, 2021, pp. 2332-2344, ISSN 2238-7854, https://doi.org/10.1016/j.jmrt.2021.09.071. (Year: 2021).*

*Primary Examiner* — Erin B Saad
*Assistant Examiner* — Carlos J Gamino

(57) ABSTRACT

The present disclosure belongs to the technical field of three-dimensional packaging, and in particular relates to a bonding method for a copper-copper metal. The bonding method includes: subjecting a copper-plated surface of a clean copper-plated substrate to pretreatment with hydrazine hydrate under a protective atmosphere, to obtain a copper-plated substrate to be bonded, where the copper-plated surface is kept at 50° C. to 90° C.; and subjecting a plurality of the copper-plated substrates to be bonded to pressurized bonding at 200° ° C. to 300° ° C. under the protective atmosphere.

11 Claims, 2 Drawing Sheets

(52) U.S. Cl.
CPC ............... *H01L 2224/80203* (2013.01); *H01L 2224/80895* (2013.01)

(56) References Cited

U.S. PATENT DOCUMENTS

| | | | | |
|---|---|---|---|---|
| 3,174,220 | A | * | 3/1965 | Durham, Jr. ....... B23K 35/3615 148/23 |
| 3,632,410 | A | * | 1/1972 | Vargo ....................... C23G 5/00 228/206 |
| 3,698,699 | A | * | 10/1972 | Bochinski .............. B23K 1/015 148/23 |
| 3,912,544 | A | * | 10/1975 | Sabatino ............. H01M 50/541 164/109 |
| 11,697,174 | B2 | * | 7/2023 | Gunner .............. B23K 20/2336 228/194 |
| 2019/0239361 | A1 | * | 8/2019 | Lo ....................... B23K 1/0016 |

* cited by examiner

BONDING METHOD FOR COPPER-COPPER METAL WITH HYDRAZINE HYDRATE

CROSS REFERENCE TO RELATED APPLICATION

This patent application claims the benefit and priority of Chinese Patent Application No. 202211721856.9 filed with the China National Intellectual Property Administration on Dec. 30, 2022, the disclosure of which is incorporated by reference herein in its entirety as part of the present application.

TECHNICAL FIELD

The present disclosure belongs to the technical field of three-dimensional packaging, and in particular relates to a bonding method for a copper-copper metal.

BACKGROUND ART

Integrated circuit (IC) manufacturing is currently an extremely-important industry in the world. In order to improve the performance and manufacturing process of IC, the research for IC has been continuously conducted.

In the past few decades, the development of IC has always followed Moore's Law, and in order to continue this law, the manufacturing process of chips has been continuously improved. However, as the chips size becomes increasingly smaller, breakthroughs in the production process have become more and more difficult. To achieve higher integration and miniaturization of electronic products, the traditional two-dimensional packaging technology can no longer meet the demand. Three-dimensional packaging technology replaces the two-dimensional packaging technology and becomes an important research object of IC packaging. In the three-dimensional packaging technology, bonding is a key technology to realize chips vertical stacking and electrical interconnection in all directions, among which copper-copper metal bonding which is able to realize chips stacking is the core of three-dimensional packaging researches.

At present, the bonding methods for copper-copper metal are as follows: (1) welding: a strong connection strength is formed by combining melting and flowing solder (such as Sn/Ag/Cu and Sn/Au); and (2) connection by adhesive: the commonly used adhesives include three types, such as isotropic conductive adhesives (ICA), anisotropic conductive adhesives (ACA), and non-conductive adhesives (NCA).

However, in the above connection methods, the existence of an intermediate layer (solder and adhesives) may increase voids between bonding surfaces and the intermediate layer or between two bonding surfaces, resulting in a poor bonding strength.

SUMMARY

In view of this, an object of the present disclosure is to provide a bonding method for a copper-copper metal. The bonding method provided by the present disclosure makes it possible to provide a higher bonding strength for the copper-copper.

The present disclosure provides a bonding method for a copper-copper metal, including the following steps:

subjecting a copper-plated surface of a clean copper-plated substrate to pretreatment with hydrazine hydrate under a protective atmosphere, to obtain the copper-plated substrate to be bonded, where the copper-plated surface is kept at a temperature of 50° ° C. to 90° ° C.; and subjecting a plurality of copper-plated substrates to be bonded to pressurized bonding at a temperature of 200° ° C. to 300° ° C. under the protective atmosphere.

In some embodiments, subjecting the copper-plated surface to pretreatment with hydrazine hydrate includes: introducing a protective gas into a hydrazine hydrate solution, such that the protective gas carries hydrazine hydrate molecules to contact the copper-plated surface to conduct the pretreatment.

In some embodiments, the hydrazine hydrate solution has a volume concentration of 0.4% to 0.6%.

In some embodiments, the protective gas is introduced into the hydrazine hydrate solution at a flow rate of 100 sccm to 300 sccm.

In some embodiments, the pressurized bonding is conducted at a force of 500 N to 600 N, and the time of heat preservation and pressure holding is 10 min to 20 min.

In some embodiments, the clean copper-plated substrate is prepared by a method comprising: subjecting a copper-plated substrate to ultrasonic cleaning.

In some embodiments, the ultrasonic cleaning includes conducting ultrasonic cleaning with acetone, ultrasonic cleaning with ethanol, and ultrasonic cleaning with deionized water sequentially.

In some embodiments, the protective gas is nitrogen.

In some embodiments, the copper-plated substrate is selected from the group consisting of copper-plated silicon and copper-plated silicon carbide.

The present disclosure provides a bonding method for a copper-copper metal, including the following steps: subjecting a copper-plated surface of a clean copper-plated substrate to pretreatment with hydrazine hydrate under a protective atmosphere, to obtain a copper-plated substrate to be bonded, where the copper-plated surface is kept at a temperature of 50° ° C. to 90° C.; and subjecting the copper-plated substrate to be bonded to pressurized bonding at a temperature of 200° ° C. to 300° C. under the protective atmosphere. In the present disclosure, the hydrazine hydrate reacts with an oxide layer on a surface of the copper-plated substrate to remove most of surface oxides (mainly including copper oxide); and then, at a certain temperature, the mutual diffusion of copper atoms on the pretreated surface leads to the bonding of two copper-plated substrates. In the bonding method, no intermediate layer is involved, and the melted copper-plated surfaces are directly contacted in pairs. Therefore, there are very few voids between the copper-plated contact surfaces, so as to achieve a relatively high bonding strength. In addition, the bonding method of the present disclosure has a simple process, and is beneficial to industrial production.

The data in examples show that a copper-copper bonding surface obtained by the bonding method of the present disclosure has a shear strength reaching 22 MPa.

DETAILED DESCRIPTION OF THE EMBODIMENTS

Figure 1:
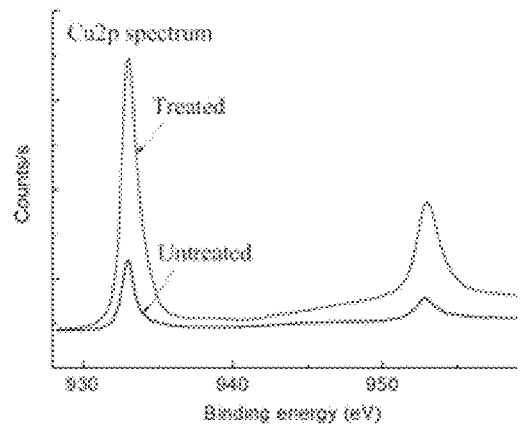
FIGS. 1A-1B show an X-ray photoelectron spectroscopy (XPS) pattern of a copper-plated surface of a copper-plated silicon substrate before and after hydrazine hydrate gas treatment in Example 1.
Figure 1:
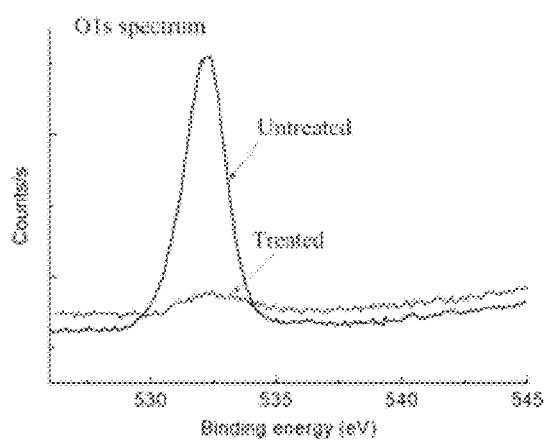

The present disclosure provides a bonding method for a copper-copper metal, including the following steps:

subjecting a copper-plated surface of a clean copper-plated substrate to pretreatment with hydrazine hydrate under a protective atmosphere, to obtain a copper-plated substrate to be bonded, where the copper-plated surface is kept at a temperature of 50° ° C. to 90° ° C.; and subjecting a plurality of the copper-plated substrates to be bonded to pressurized bonding at a temperature of 200° ° C. to 300° C. under the protective atmosphere.

In the present disclosure, a copper-plated surface of a clean copper-plated substrate is subjected to pretreatment with hydrazine hydrate under a protective atmosphere, to obtain a copper-plated substrate to be bonded.

In some embodiments of the present disclosure, the protective gas is nitrogen. In some embodiments, the copper-plated substrate is selected from the group consisting of a copper-plated silicon substrate and a copper-plated silicon carbide substrate. There is no special limitation on a size of the copper-plated substrate; in an example, the size is specifically limited to 10 mm*10 mm.

In the present disclosure, the clean copper-plated substrate is prepared by a method including: subjecting a copper-plated substrate to ultrasonic cleaning.

In the present disclosure, the ultrasonic cleaning is conducted at a frequency of preferably 30 Hz to 50 Hz, more preferably 40 Hz. In some embodiments, the ultrasonic cleaning includes conducting ultrasonic cleaning with acetone, ultrasonic cleaning with ethanol, and ultrasonic cleaning with deionized water sequentially. The ultrasonic cleaning with acetone is conducted for preferably 4 min to 6 min, more preferably 5 min; and the ultrasonic cleaning with acetone is conducted preferably 2 to 3 times. The ultrasonic cleaning with ethanol is conducted for preferably 4 min to 6 min, more preferably 5 min; and the ultrasonic cleaning with ethanol is conducted preferably 2 to 3 times. The ultrasonic cleaning with deionized water is conducted for preferably 4 min to 6 min, more preferably 5 min; and the ultrasonic cleaning with deionized water is conducted preferably 2 to 3 times.

In some embodiments of the present disclosure, after the ultrasonic cleaning, the bonding method further includes blow-drying a cleaned substrate with nitrogen.

In the present disclosure, subjecting the copper-plated surface to pretreatment with hydrazine hydrate includes: introducing a protective gas into a hydrazine hydrate solution, such that the protective gas carries hydrazine hydrate molecules to contact the copper-plated surface to conduct the pretreatment.

In some embodiments of the present disclosure, the pretreatment is conducted in a bonding cavity of a chip bonding machine. The pretreatment in the bonding cavity specifically includes: placing the copper-plated surface of each copper-plated substrate opposite to each other and placing in the bonding cavity; and introducing a protective gas into a hydrazine hydrate solution, such that the protective gas carries hydrazine hydrate molecules to contact the copper-plated surface to conduct the pretreatment. In the present disclosure, the protective gas is introduced into the hydrazine hydrate solution at a flow rate of preferably 100 sccm to 300 sccm, more preferably 200 sccm. The hydrazine hydrate solution has a volume concentration of preferably 0.4% to 0.6%, more preferably 0.5%.

In the present disclosure, during the pretreatment, the copper-plated surface is at a temperature of 50° ° C. to 90° C., preferably 60° C. to 80° C., and is kept at the temperature for preferably 10 min to 30 min, more preferably 20 min. In some embodiments, the pretreatment is conducted in the cavity of the chip bonding machine.

In the present disclosure, a plurality of the copper-plated substrates to be bonded are subjected to pressurized bonding under the protective atmosphere.

In some embodiments of the present disclosure, the protective gas is nitrogen.

In the present disclosure, the pressurized bonding is conducted at a force of preferably 500 N to 600 N, more preferably 550 N and a temperature of preferably 200° C. to 300° C., more preferably 220° C. to 280° C. for preferably 10 min to 20 min, more preferably 15 min.

In some embodiments of the present disclosure, the pressurized bonding is conducted in the bonding cavity of the chip bonding machine.

In order to further illustrate the present disclosure, the technical solutions provided by the present disclosure are described in detail below in conjunction with examples, but these examples should not be understood as limiting the claimed scope of the present disclosure.

Example 1

Two copper-plated silicon substrates to be bonded (each having a size of 10 mm*10 mm) were separately subjected to ultrasonic cleaning with acetone, ethanol, and deionized water in sequence at a frequency of 40 Hz, 2 times for 5 min in each time. After cleaning, the copper-plated silicon substrates to be bonded were blow-dried with $N_2$, subjected to center aligning, and placed into a cavity sample stage of a bonding device.

Nitrogen was introduced into a hydrazine hydrate solution with a volume concentration of 0.5% at a flow rate of 200 sccm, and the nitrogen carried hydrazine hydrate molecules into the cavity of the bonding device to conduct pretreatment on a copper surface of the copper-plated substrate at 70° C. for 20 min, such that the hydrazine hydrate reacted with the surface of the copper-plated substrate to reduce copper oxide on the surface.

The $N_2$ was introduced. The substrate to be bonded in a $N_2$ atmosphere was heated to a bonding temperature of 200° C., and the bonding was carried out at the constant bonding temperature and a force of 550 N for 15 min, so as to realize the bonding of the two copper-plated silicon substrates.

FIGS. 1A-1B show an XPS pattern of the copper-plated surface of the copper-plated silicon substrate before and after the hydrazine hydrate gas treatment in Example 1. It can be seen from FIGS. 1A-1B that compared with an untreated copper-plated surface, the treated sample has a significantly higher Cu peak and a significantly lower O peak, indicating that the hydrazine hydrate gas has a desirable reduction effect on oxides of the copper surface.

Figure 2:
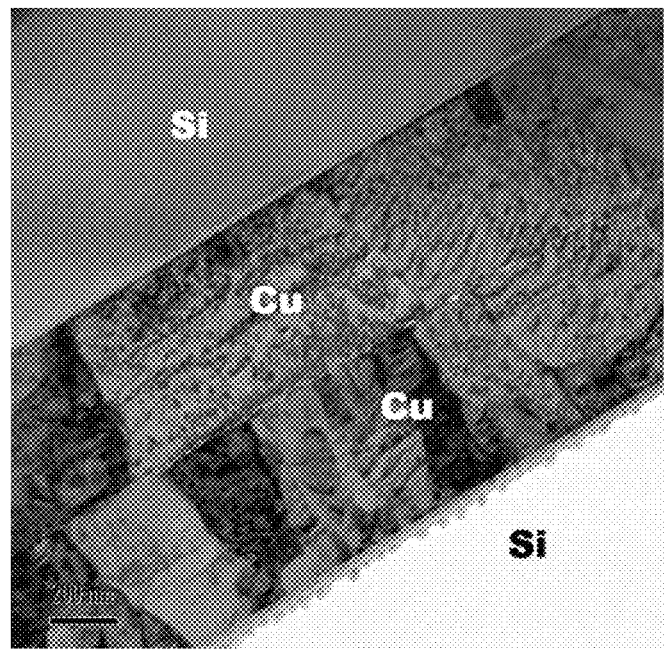
FIG. 2 shows a scanning electron microscopy (SEM) image of a bonded surface of the copper-plated silicon substrate after the hydrazine hydrate gas pretreatment in Example 1.

FIG. 2 shows a SEM image of a bonded surface of the copper-plated silicon substrate after the hydrazine hydrate gas pretreatment in Example 1. It can be seen from the figure that the copper is well bonded, with almost no voids.

Example 2

This example was different from Example 1 only in that the bonding temperature is 250° C.

Example 3

This example was different from Example 1 only in that the bonding temperature is 300° C.

Example 4

This example was different from Example 2 in that the pretreatment was conducted at 90° C. for 20 min. After testing, the bonding strength is 21.5 MPa.

Example 5

This example was different from Example 1 in that the copper-plated silicon substrate was replaced with a copper-plated SiC substrate, resulting in a bonding strength of about 22 MPa.

Figure 3:
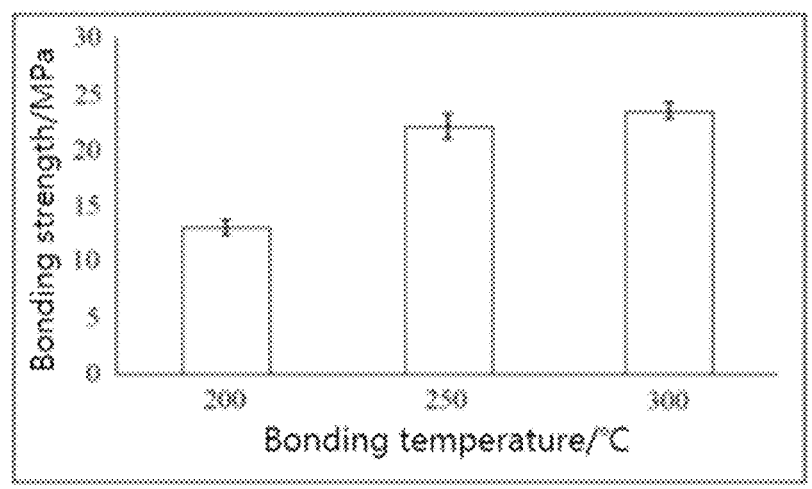
FIG. 3 shows a histogram of bonding strengths of the copper-plated silicon substrates in Examples 1 to 3.

In the present disclosure, the bonding strengths (shearing strengths) of the bonded copper-plated silicon substrates in Examples 1 to 3 were tested by a shear force tester, and the test results are shown in FIG. 3. It can be seen from FIG. 3 that the bonded product prepared in Example 1 (at a bonding temperature of 200° ° C. has a bonding strength of 14 MPa; the bonded product prepared in Example 2 has a bonding strength of 21 MPa; and the bonded product prepared in Example 3 has a bonding strength of 22 MPa. This proves that as the bonding temperature increased, the bonding strength gradually increased, with an increase that is no longer obvious after 250° C. Note: in the present disclosure, the results mentioned when testing the bonding strength each were an average obtained by conducting three tests on the bonded products in each example.

The above descriptions are merely preferred embodiments of the present disclosure. It should be noted that a person of ordinary skill in the art may further make several improvements and modifications without departing from the principle of the present disclosure, but such improvements and modifications should be deemed as falling within the protection scope of the present disclosure.

What is claimed is:

1. A bonding method for a copper-copper metal, comprising the following steps:
   providing copper-plated substrates;
   subjecting copper-plated surfaces of clean copper-plated substrates to pretreatment with hydrazine hydrate under a protective atmosphere, to obtain copper-plated surfaces to be bonded, wherein the clean copper-plated substrates are kept at a temperature of 50° C. to 90° C. during the pretreatment; and
   subjecting a plurality of the copper-plated substrates to be bonded to pressurized bonding at a temperature of 200° C. to 300° C. under the protective atmosphere,
   wherein the copper-plated substrates are selected from the group consisting of copper-plated silicon and coper-plated silicon carbide.

2. The bonding method according to claim 1, wherein subjecting the copper-plated surfaces to pretreatment with hydrazine hydrate comprises: introducing a protective gas into a hydrazine hydrate solution, such that the protective gas carries hydrazine hydrate molecules to contact the copper-plated surfaces to conduct the pretreatment.

3. The bonding method according to claim 2, wherein the hydrazine hydrate solution has a volume concentration of 0.4% to 0.6%.

4. The bonding method according to claim 2, wherein the protective gas is introduced into the hydrazine hydrate solution at a flow rate of 100 sccm to 300 sccm.

5. The bonding method according to claim 1, wherein the pressurized bonding is conducted at a force of 500 N to 600 N for 10 min to 20 min.

6. The bonding method according to claim 1, wherein the clean copper-plated substrates are prepared by a method comprising: subjecting the copper-plated substrates to ultrasonic cleaning.

7. The bonding method according to claim 6, wherein the ultrasonic cleaning comprises conducting ultrasonic cleaning with acetone, ultrasonic cleaning with ethanol, and ultrasonic cleaning with deionized water sequentially.

8. The bonding method according to claim 2, wherein the protective gas is nitrogen.

9. The bonding method according to claim 3, wherein the protective gas is introduced into the hydrazine hydrate solution at a flow rate of 100 sccm to 300 sccm.

10. The bonding method according to claim 1, wherein the pressurized bonding is conducted at 300° C., the copper-plated substrates are the copper plated silicon, and a copper-copper bonding surface obtained by the bonding method has a shear strength reaching 22 MPa.

11. The bonding method according to claim 1, wherein the pressurized bonding is conducted at 200° C., the copper-plated substrates are the copper-plated silicon carbide, and a copper-copper bonding surface obtained by the bonding method has a shear strength reaching 22 MPa.

\* \* \* \* \*